(12) United States Patent
Ngo et al.

(10) Patent No.: US 6,523,145 B1
(45) Date of Patent: Feb. 18, 2003

(54) METHOD AND APPARATUS FOR TESTING A CONTENTS-ADDRESSABLE-MEMORY-TYPE STRUCTURE USING A SIMULTANEOUS WRITE-THRU MODE

(75) Inventors: Tai Dinh Ngo, Austin; Philip George Shephard, III, Round Rock, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,877

(22) Filed: Nov. 8, 1999

(51) Int. Cl.$^7$ .......................... G01R 31/28; G11C 29/00
(52) U.S. Cl. .................. 714/733; 714/718; 714/734; 365/189.04
(58) Field of Search ................................ 714/733, 725, 714/724, 726, 727, 729, 734, 718; 365/189.04, 201, 220, 230.01

(56) References Cited

U.S. PATENT DOCUMENTS

| | | | | |
|---|---|---|---|---|
| 4,672,583 A | * | 6/1987 | Nakaizumi | 365/222 |
| 4,680,760 A | * | 7/1987 | Giles et al. | 714/718 |
| 5,619,462 A | * | 4/1997 | McClure | 365/201 |
| 5,691,950 A | * | 11/1997 | McClure | 365/230.03 |

* cited by examiner

*Primary Examiner*—Christine T. Tu
(74) *Attorney, Agent, or Firm*—Duke W. Yee; Anthony V. S. England

(57) ABSTRACT

A method and apparatus for testing a contents-addressable-memory type structure using a simultaneous write-thru mode in an array is provided. The circuit to be tested has combinational logic and an array, and the array has bit cells and a logic cells. Each logic cell is uniquely associated with a bit cell such that an output of a bit cell provides an input to a logic cell, and each set of logic cells for an address of the array provides an output data vector from the array. Each cone of logic in the combinational logic receives an output data vector from an associated address in the array as an input data vector, and each cone of logic in the combinational logic is independent from other cones of logic in the combinational logic. A test vector is input to a write port of the array, and a set of logic cell input values are also input into the array. A test write-thru mode signal simultaneously asserts all write wordline signals of the array associated with the write port in order to write the test vector to all addresses of the array. Test vectors can then be applied simultaneously to all the cones in the combinatorial logic instead of having to apply them to one array address at a time, thereby making it feasible to test this combinatorial logic using standard logic testing techniques. The non-CAM compare type array operations are then tested using ABIST techniques.

9 Claims, 4 Drawing Sheets

METHOD AND APPARATUS FOR TESTING A CONTENTS-ADDRESSABLE-MEMORY-TYPE STRUCTURE USING A SIMULTANEOUS WRITE-THRU MODE

BACKGROUND OF THE INVENTION

1. Technical Field

The present invention relates generally to testing integrated circuits. More particularly, the present invention relates to a method and apparatus for digital logic testing using built-in test circuitry.

2. Description of Related Art

In general, integrated circuit arrays are tested by providing a known data input at a known address to the array and comparing the output to an expected output. One well known and widely used prior art system for testing integrated circuit logic, particularly integrated circuit memory arrays, is to form a dedicated test circuit on the chip with the array itself. This circuit also is called an array built-in self-test (ABIST) circuit or engine. This type of technology allows for high speed testing without having to force correspondence between the array and input/output connections to the chip itself. Random access memory on a chip, such as the memory provided for processors, are usually tested using an ABIST engine.

Some embedded memory designs have content-addressable-memory-type (CAM-type) structures that are significantly more complex than a simple compare function. This CAM-type compare logic does not lend itself to standard ABIST techniques due to its complexity yet cannot be isolated from array cells providing inputs into the compare logic.

Specifically, a standard ABIST testing technique could be used to test a standard CAM. However, in a complex compare structure in which an array core has combinational logic that is closely coupled with the operation of the cells in the array such that each individual cell in the array provides an input into a unique logic function, the operation of the complex compare logic cannot be isolated from the RAM cells due to the characteristic of having as many inputs as there are bits-cells in the array. As a result, standard testing techniques do not provide a mechanism for testing the complex compare logic.

A straightforward yet very inefficient solution to testing such a structure might embed a scannable latch for every bit cell in the array such that the latch could be loaded with a value to be input into the complex compare logic, and the output from the complex compare logic could then be compared against an expected value given the input value. Clearly, such a solution would quickly obviate its very purpose.

The other alternative is to test the complex compare logic using logic test techniques like deterministic test patterns from an ATPG (Automatic Test Pattern Generation) program, or LBIST (Logic Built in Self Test). However, testing of the complex compare logic with these techniques would require writing and then reading each address in the array multiple times. This results in a significant increase in the number and complexity of the test patterns that are required.

Therefore, it would be advantageous to have an improved method and apparatus for selectively applying test vectors to the circuit inputs while minimizing both the amount of test circuitry that is added, and the difficulty of testing the complex CAM compare logic with standard logic test techniques.

SUMMARY OF THE INVENTION

A method and apparatus for testing a contents-addressable-memory type structure using a simultaneous write-thru mode in an array is provided. The circuit to be tested has combinational logic and an array, and the array has bit cells and a logic cells. Each logic cell is uniquely associated with a bit cell such that an output of a bit cell provides an input to a logic cell, and each set of logic cells for an address of the array provides an output data vector from the array. Each cone of logic in the combinational logic receives an output data vector from an associated address in the array as an input data vector, and each cone of logic in the combinational logic is independent from other cones of logic in the combinational logic. A test vector is input to a write port of the array, and a set of logic cell input values are also input into the array. A test write-thru mode signal simultaneously asserts all write wordline signals of the array associated with the write port in order to write the test vector to all addresses of the array. Test vectors can then be applied simultaneously to all the cones in the combinatorial logic instead of having to apply them to one array address at a time, thereby making it feasible to test this combinatorial logic using standard logic testing techniques. The non-CAM compare type array operations are then tested using ABIST techniques.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
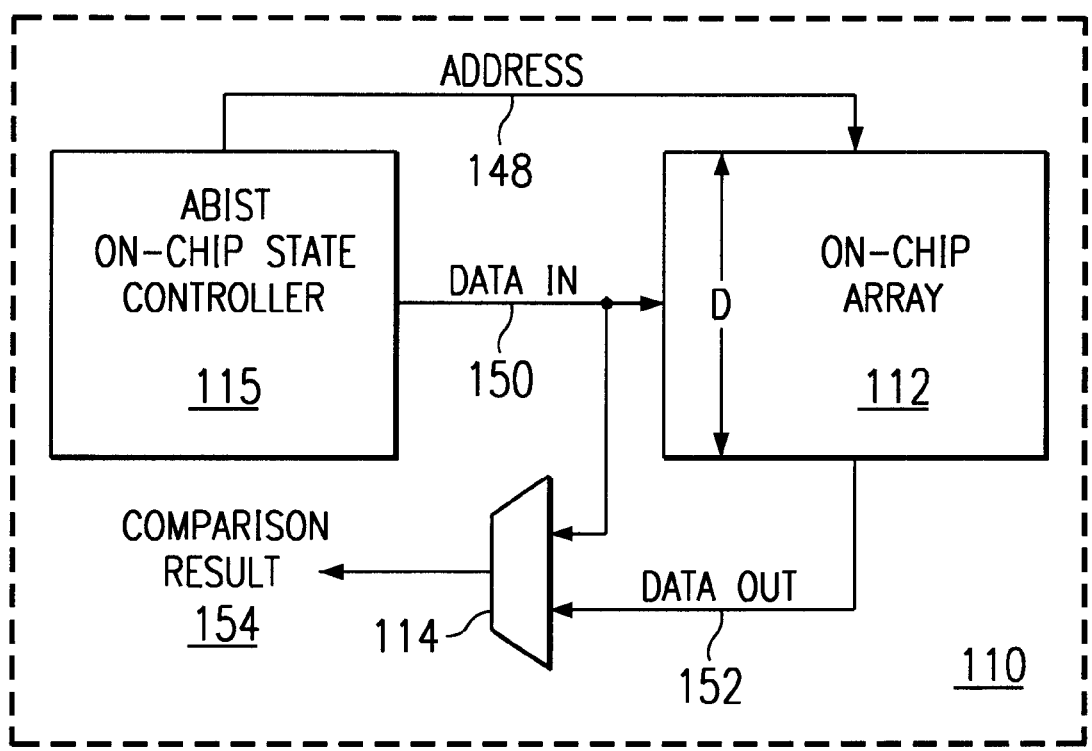
FIG. 1 is a block diagram illustrating a standard test configuration for an integrated circuit chip having a memory array.

With reference now to FIG. 1, a block diagram illustrates a standard test configuration for an integrated circuit having a memory array. A region 110 of an integrated circuit chip has formed therein a memory array 112, which is D bits wide. Also formed in region 110, in close proximity to the array 112, is an array built-in self-test system (ABIST), which includes a programmable state controller 115. The programmable state controller 115 generates a sequence of data pattern inputs 150 and address inputs 148 to the array 112. The data pattern is read into the array 112 and then read out. Comparator 114 compares data output 152 of the array with an expected data output pattern, e.g., the input data pattern, and provides output 154.

In FIG. 1, a test vector is applied to an array, and the resulting output is compared to a known value to check whether the array performs as expected or whether the array has a defect or flaw in its hardware that should prevent its individual sale or its incorporation into another component or a larger data processing system. Simple CAM compare structures lend themselves to ABIST techniques.

Figure 2A:
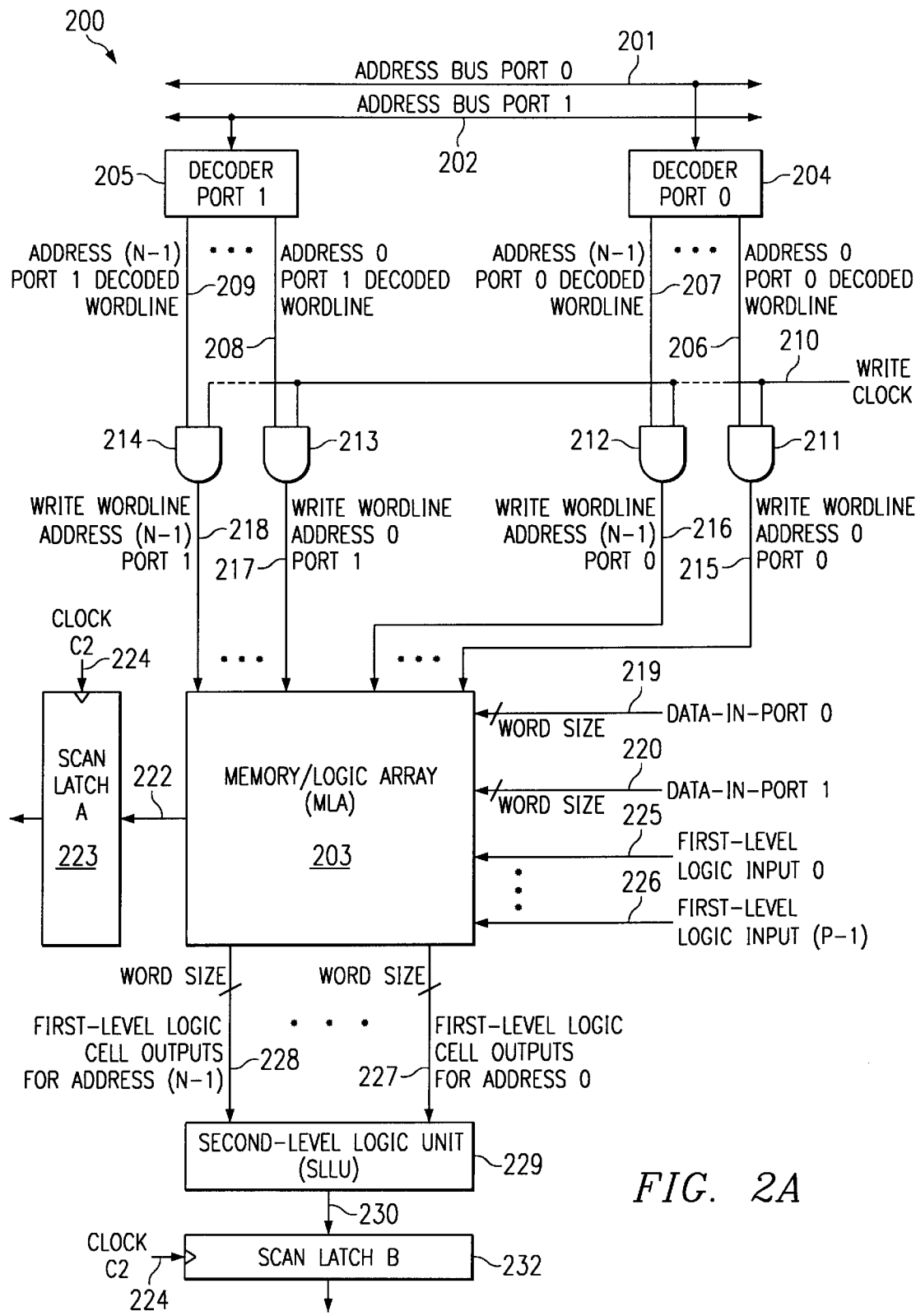
FIG. 2A is a block diagram depicting a configuration for an integrated circuit chip having a memory array and a contents-addressable-memory-type (CAM-type) structure with complex compare logic.

With reference now to FIG. 2A, a block diagram depicts a configuration for an integrated circuit having a memory/logic array containing array cells and a first-level contents-addressable-memory-type (CAM-type) structure of complex compare logic units generating input values to a second-level CAM-type structure. This type of circuitry does not lend itself to a standard ABIST-type test configuration as shown in FIG. 1.

Circuit 200 contains address port 0 bus 201 and address port 1 bus 202 that carry addresses accessing memory/logic array (MLA) 203. Decoder 204 for port 0 and decoder 205 for port 1 decode the addresses on the address buses to assert wordlines 206–209. MLA 203 is assumed to have N words of data storage addressable by N addresses. When address 0 appears on address port 0 bus 201, decoder 204 for port 0 decodes the address and asserts address 0 port 0 decoded wordline 206. When address (N–1) appears on address port 0 bus 201, decoder 204 for port 0 asserts address (N–1) port 0 decoded wordline 207. In the example shown in the figure, MLA 203 is shown to have multiple write ports. Alternatively, MLA 203 may be configured with a single write port.

Decoded wordlines 206–209 are input into AND gates 211–214 and clocked with write clock 210. The outputs of AND gates 211–214 provide write wordline signals 215–218 that are input into MLA 203. For example, when address 0 appears on address port 0 bus 201, write wordline address 0 port 0 signal 215 is input into MLA 203 on the next assertion of write clock 210.

MLA 203 accepts data-in port 0 signals 219 and data-in port 1 signals 220 for writing data into the cells of MLA 203. The width of input lines 219 and 220 are assumed to be the same number of bits as the word size supported by the data processing system containing circuit 200. However, the size of the inputs may vary depending upon system implementation.

MLA 203 may also be controlled to read data from its cells and to provide the data stored within it as outputs. Output 222 may be controlled using conventional test techniques, such as ABIST, to observe the contents of the cells in MLA 203. The data may be accepted by scan latch A 223 that may be controlled during a test mode using clock C2 224 to retrieve the contents of MLA 203 and compare the retrieved values with expected values to determine whether MLA is operating properly. In this manner, MLA 203 provides standard memory access functionality by accepting signals that specify particular memory locations and data input signals that specify data to be stored in those memory locations. For simplicity, the read ports of MLA 203 are not shown.

It should be noted that MLA 203 may accept other control signals. Alternatively, MLA 203 may be configured such that a single physical component accepts address bus inputs and the write clock signal in addition to data input signals and other control signals rather than having such functionality in physically separate components.

MLA 203 also accepts first-level logic input 225–226. As shown in the figure, P different inputs may be supplied to MLA 203. The first-level logic inputs provide input values to logic cells within MLA 203. These first level logic cells accept the first-level logic inputs and the values stored within the bit cells in the memory portion of MLA 203. Each of these first-level logic level cells may provide distinct logic functionality that differs from one logic cell to another. However, each logic cell has a unique input derived from a unique bit cell within the memory portion of MLA 203. These logic cells are described in more detail further below with respect to FIG. 2B.

MLA 203 provides data outputs 227–228 that are used as inputs into second-level logic unit (SLLU) 229. The number of first-level logic cell outputs is equal to the number of words stored in MLA 203. In the example shown in the figure, N outputs are provided to SLLU 229. Each of these outputs is equal in width to the number of bits in the word size of the system. Each first-level logic cell output from an array address feeds a cone of logic within SLLU 229 that is completely independent of other cones of logic for the other array addresses. In other words, each logic function provided by SLLU 229 is independent for each data bus input. There can be additional external inputs to the SLLU, and it can have an arbitrary number of outputs.

Second-level logic unit 229 observes the values of the cells and performs a combinational logic function upon all of those values simultaneously. SLLU 229 may have other control signals which are not shown. SLLU 229 provides outputs 230 to scan latch(s) B 232 where there is at least one scan latch for each address in the RAM. These scan latches may be read using clock C2 224 in order to obtain values during a test mode that are compared against expected values to determine whether MLA 203 and SLLU 229 operate in an expected and proper manner. The manner in which the output values are obtained from SLLU 229 may vary depending upon system implementation.

Figure 2B:
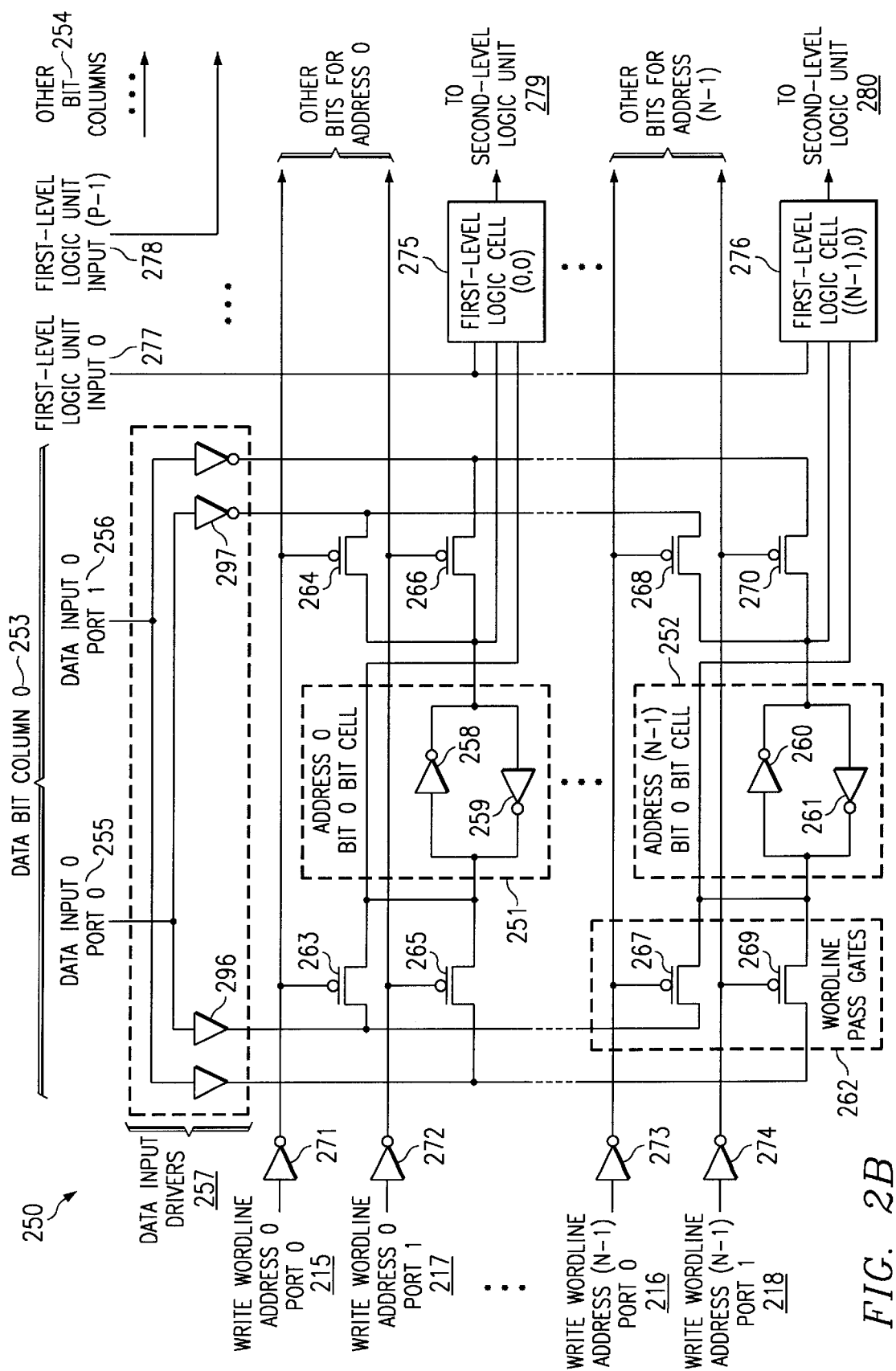
FIG. 2B is a diagram depicting a logic circuit for the array cells and first-level CAM-type structure of complex compare logic units incorporated in the memory/logic array shown in FIG. 2A.

With reference now to FIG. 2B, a diagram depicts a logic circuit for the array cells and first-level CAM-type structure of complex compare logic units incorporated in the memory/logic array shown in FIG. 2A. Similar reference numerals in FIG. 2A and FIG. 2B refer to common elements in the figures. FIG. 2B shows finer detail of the interior circuitry of MLA 203 shown in circuit 200 in FIG. 2A.

MLA 203 contains a predetermined number of bit cells and logic cells. Circuit 250 shows 2 exemplary bit cells and 2 exemplary logic cells and their associated inputs, control signals, and outputs. Bit cell 251 provides a single bit of storage for bit 0 at address 0. Bit cell 252 provides a single bit of storage for bit 0 at address (N–1). These bit cells may be viewed as being arranged in a data bit column, such as data bit column 0 253. The size of a data bit column is equal to the number of address locations within the array. In the example shown, N words are stored within the array. For example, write wordline address 0 port 0 signal 215 and write wordline address 0 port 1 signal 217 direct data input bits to the bit cells for address 0. Write wordline address (N–1) port 0 signal 216 and write wordline address (N–1) port 1 signal 218 direct data input bits to the bit cells for address (N–1). Other bit columns 254 would provide storage for bit 1 through the last bit of the word size supported by the array.

Data input bit 0 255 from port 0 is fed to the bit cells in data bit column 0 253 along with data input bit 0 256 for port 1. These signals provide the input values to be stored in the bit cells. Data input drivers 257 provide double buffering for each input signal for better performance response characteristics. Each input bit may be gated to the positive logic input of the bit cells while the complement of the input bit may be gated to the negative logic input of the bit cells. Each cell may be constructed using cross-coupled inverters. For example, bit cell 251 is formed by inverters 258 and 259, and bit cell 252 is formed by inverters 260 and 261.

Wordline pass gates are used to direct the data inputs to the proper bit cells. In the figure, the wordline pass gates are formed by p-channel transistors 263–270. Write wordlines 215–218 activate the gates as necessary to direct the inputs to the proper bit cell. Inverters 271–274 work in conjunction with the p-channel type transistors to allow a logical value of a data input into a bit cell. For example, when write wordline address 0 port 0 signal 215 is asserted, inverter 271 pulls its output low, which then turns on p-channel transistors 263 and 264 to allow the data bit on data input 0 port 0 signal 255 into bit cell 251. In this manner, the write wordline signals provide address control for directing the data input values to the proper bit cells.

As stated previously, MLA 203 contains both memory cells and logic cells that operate in conjunction to generate an output value that is independently computed for each address in MLA 203. For each bit cell in circuit 250, a first-level logic cell accepts the value of the bit cell and its complement as inputs into the logic cell. For example, first-level logic cell 275 accepts the value of bit cell 251 and its complement as inputs. Similarly, first-level logic cell 276 accepts the value of bit cell 252 and its complement as input. Logic cells 275–276 also accept first-level logic inputs 277–278 that serve as logic function inputs to each of these cells. The number of first-level logic inputs may vary depending upon system implementation. In the example shown, there are P inputs that are fed to the logic cells. The first-level logic inputs may be fed into the logic cells in a variety of manners depending upon the logic function desired for a particular logic cell.

The combinational logic function provided by first-level logic cell 275 may differ from first-level logic cell 276. As there are a number of unique bit cells in the array, which is given by the number of addresses times the number of bits in the word sized supported by the array, there is an equal number of logic cells in the array, and each logic cell uniquely corresponds with an individual bit cell. Hence, there may be a number of independent and unique combinational logic functions in circuit 250 which is also equal to the number of addresses times the number of bits in the word size supported by the array.

Each logic cell supplies its own output value that is provided to the second-level logic unit, such as output values 279 and 280. In this manner, the logic functions in the memory/logic array are inseparable from the bit cells in the array. Each portion of circuit 250 contained within a logic cell is affected by the array cell values. Hence, to test the circuitry contained within the first-level logic cells and the second-level logic unit requires the ability to control the inputs and outputs of the bit cells in the array. This configuration of circuitry does not lend itself to a standard ABIST test due to its complexity. ABIST lends itself to testing regular, sequential structures, but becomes difficult to design, and can become prohibitively complex when attempting to test complex combinatorial logic.

Figure 2C:
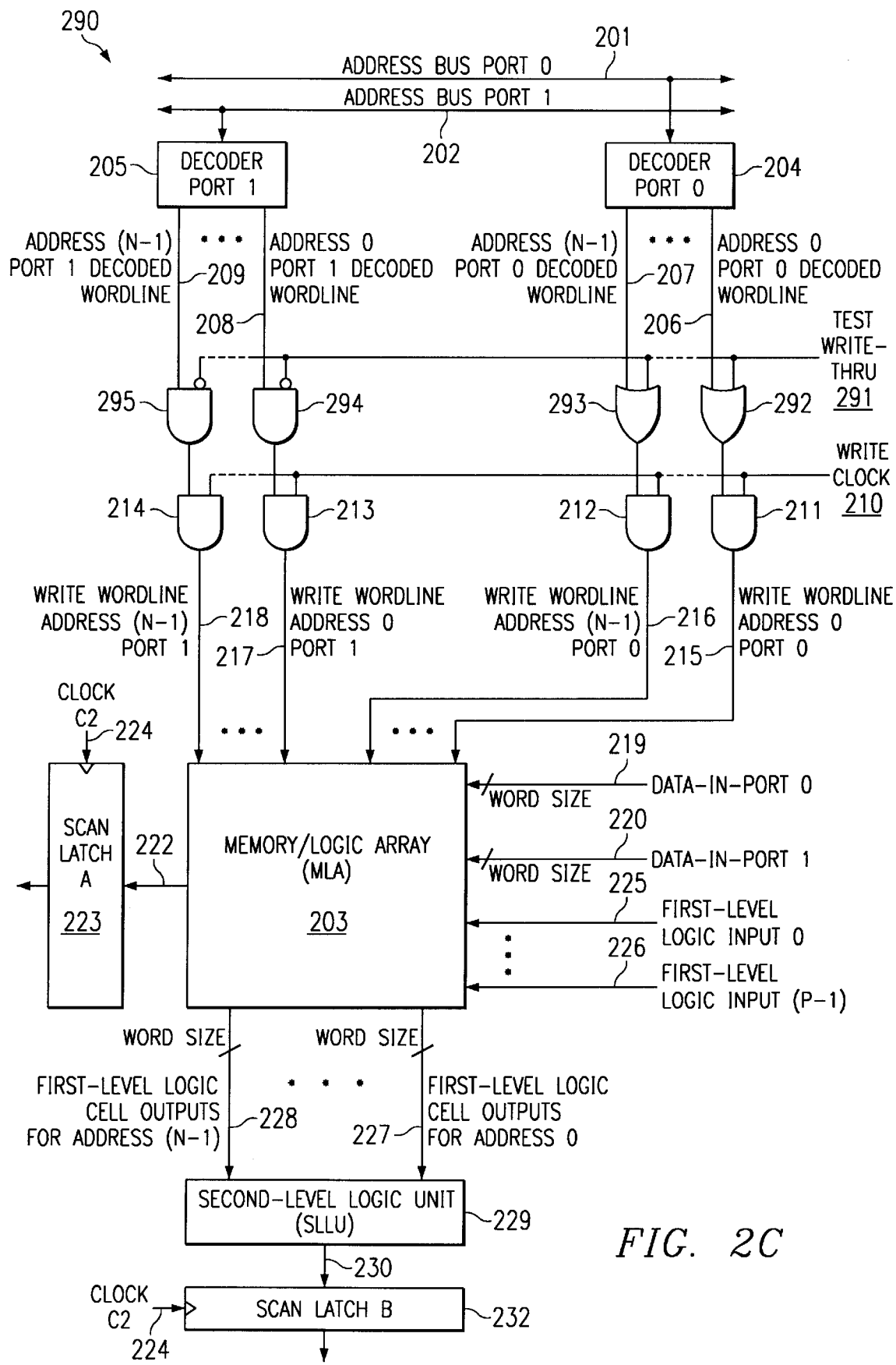
FIG. 2C is a block diagram depicting a modified configuration of an integrated circuit, as shown in FIG. 2A, combined with test circuitry as provided in accordance with a preferred embodiment of the present invention.

With reference now to FIG. 2C, a block diagram depicts a modified configuration of an integrated circuit, as shown in FIG. 2A, combined with test circuitry as provided in accordance with a preferred embodiment of the present invention. Similar reference numerals in FIG. 2A and FIG. 2C refer to common elements in the figures. FIG. 2C shows the modifications necessary to circuit 200 in FIG. 2A in order to provide a manner of testing the circuit in accordance with a preferred embodiment of the present invention.

Circuit 200 in FIG. 2A has been modified in accordance with a preferred embodiment of the present invention to yield circuit 290 in FIG. 2C. Circuit 290 contains similar elements as in circuit 200. However, test write-thru signal 291 has been added. Instead of inputting decoded wordlines 206–209 directly into AND gates 211–214 to be gated by write clock 210, decoded wordlines 206–207 are input into OR gates 292–293 in conjunction with decoded wordlines 208–209 being input into AND gates 294–295. The decoded wordlines for port 0 are directly input into OR gates 292–293 along with a direct input of test write-thru signal 291. The decoded wordlines for port 1 are directly input into AND gates 294–295 along with the complement of test write-thru signal 291 as signified by the negative logic dots on the respective inputs of AND gates 294–295.

When test write-thru signal 291 is asserted and write clock 210 goes active, all of the write wordline signals for port 0 will be asserted simultaneously. At the same time, when test write-thru 291 is asserted, AND gates 294–295 will see a logical 0 as an input, and all of the write wordline signals for port 1 will be de-asserted when write clock 210 is asserted. In this manner, test write-thru 291 provides simultaneous write wordline signals for one of the ports, e.g. port 0, of MLA 203.

When all of the write wordline signals for a particular port are asserted, the array is forced to write the values on the data inputs of the corresponding write port to all addresses in the array. Hence, a test vector may be forced in a simultaneous write-thru mode to propagate through the bit cells for all of the words at all of the addresses in the array. The values thus stored in the bit cells of the array are then provided as inputs to the logic cells of the array in conjunction with the first-level logic input values, thereby providing known input values to the first-level logic cells.

The first-level logic cells then compute output values that are supplied as input values to the second-level logic unit, which then computes its own output values. The output values from the second-level logic unit may then be compared with expected values to determine whether the circuitry in the first-level logic cells and the second-level logic unit are operating as expected. Hence, the test write-thru signal provides a manner for directing the data inputs on a write port of the memory/logic array through the circuitry to be tested. The circuitry to be tested then provides output values that may be checked to determine whether the test was successful or not. The test write-thru signal essentially acts as a control signal that causes the memory/logic array to be transparent to the test vector; the memory/logic array directs the test vector value through the bit cells, through the first-level logic cells, and thereby the second-level logic unit.

It should be noted that the data input drivers on the data input lines for the write port that is used in the simultaneous write-thru mode, such as data input drivers 296 and 297, must possess sufficient strength or power to simultaneously drive all of the gates associated with writing all addresses simultaneously. However, the same power or strength is not required by the data input drivers of the other write ports that are not used for a simultaneous write-thru mode.

The advantages of the present invention should be apparent in view of the detailed description provided above. In previous solutions to testing such complex compare logic structures, this type of problem has been addressed either by manually writing test vectors or functional tests, which is labor intensive, or by attempting to get the automatic test pattern generation (ATPG) tools necessary to generate the test patterns by writing and then reading every address in these types of designs, which is expensive in terms of test generation and application time.

The present invention provides a mechanism for testing complex compare logic for a CAM-type structure. By adding logic used in a test mode to the RAM/CAM structure, the array is forced to write to all of its bit cells simultaneously such that the values on the data-inputs to the write port are forced through the array in a simultaneous write-thru mode to propagate through the bit cells for all the addresses in the RAM. The bit cell values then feed the complex compare logic based on the values at the data-input write ports. This mechanism provides ease in testing the complex compare logic with standard logic testing techniques by propagating the required test vectors from data-inputs of the RAM through all its addresses, without having to separately write each address of the RAM for each of the test patterns that is required to test the complex compare logic. This reduces both the effort required to generate test patterns and the number of test patterns that are required to test the circuit.

It is important to note that while the present invention has been described in the context of a fully functioning data processing system, those of ordinary skill in the art will appreciate that the processes of the present invention are capable of being distributed in the form of a computer readable medium of instructions, including microcode, and a variety of forms and that the present invention applies equally regardless of the particular type of signal bearing media actually used to carry out the distribution. Examples of computer readable media include recordable-type media such as a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing a circuit comprising combinational logic and an array, wherein the array comprises a plurality of bit cells and a plurality of logic cells, wherein each logic cell is uniquely associated with a bit cell such that an output of a bit cell provides an input to a logic cell, wherein each set of logic cells for an address of the array provides an output data-vector from the array, wherein each cone of logic in the combinational logic receives an output data vector from an associated address in the array as an input data vector, and wherein each cone of logic in the combinational logic is independent from other cones of logic in the combinational logic, the method comprising the steps of:

inputting a test vector at a write port of the array;
inputting a set of logic cell input values into the array; and
asserting simultaneously all write wordline signals of the array associated with the write port in order to write the test vector to all addresses of the array.

2. The method of claim 1 further comprising:
testing the logic cells with standard logic test techniques while asserting simultaneously all write wordline signals of the array associated with the write port.

3. The method of claim 1, wherein the array comprises a plurality of write ports, the method further comprising:

disabling simultaneously all write wordline signals of the array associated with write ports of the array other than the write port receiving the test vector.

4. An apparatus for testing a circuit comprising combinational logic and an array, wherein the array comprises a plurality of bit cells and a plurality of logic cells, wherein each logic cell is uniquely associated with a bit cell such that an output of a bit cell provides an input to a logic cell, wherein each set of logic cells for an address of the array provides an output data vector from the array, wherein each cone of logic in the combinational logic receives an output data vector from an associated address in the array as an input data vector, and wherein each cone of logic in the combinational logic is independent from other cones of logic in the combinational logic, the apparatus comprising:

first inputting means for inputting a test vector at a write port of the array;
second inputting means for inputting a set of logic cell input values into the array; and
asserting means for asserting simultaneously all write wordline signals of the array associated with the write port in order to write the test vector to all addresses of the array.

5. The apparatus of claim 4 further comprising:
testing means for testing the logic cells with standard logic test techniques while asserting simultaneously all write wordline signals of the array associated with the write port.

6. The apparatus of claim 4, wherein the array comprises a plurality of write ports, the apparatus further comprising:
disabling means for disabling simultaneously all write wordline signals of the array associated with write ports of the array other than the write port receiving the test vector.

7. A computer program product in a computer-readable medium for use in a data processing system for testing a circuit comprising combinational logic and an array, wherein the array comprises a plurality of bit cells and a plurality of logic cells, wherein each logic cell is uniquely associated with a bit cell such that an output of a bit cell provides an input to a logic cell, wherein each set of logic cells for an address of the array provides an output data vector from the array, wherein each cone of logic in the combinational logic receives an output data vector from an associated address in the array as an input data vector, and wherein each cone of logic in the combinational logic is independent from other cones of logic in the combinational logic, the computer program product comprising:

first instructions for inputting a test vector at a write port of the array;
second instructions for inputting a set of logic cell input values into the array; and
third instructions for asserting simultaneously all write wordline signals of the array associated with the write port in order to write the test vector to all addresses of the array.

8. The method of claim 7 further comprising:
instructions for testing the logic cells with standard logic test techniques while asserting simultaneously all write wordline signals of the array associated with the write port.

9. The computer program product of claim 7, wherein the array comprises a plurality of write ports, the method further comprising:
instructions for disabling simultaneously all write wordline signals of the array associated with write ports of the array other than the write port receiving the test vector.

* * * * *

UNITED STATES PATENT AND TRADEMARK OFFICE
CERTIFICATE OF CORRECTION

PATENT NO. : 6,523,145 B1
DATED : February 18, 2003
INVENTOR(S) : Ngo et al.

It is certified that error appears in the above-identified patent and that said Letters Patent is hereby corrected as shown below:

<u>Title page,</u>
Item [57], ABSTRACT,
Lines 19 and 21, delete "combinatorial" and insert -- combinational --.

<u>Column 7,</u>
Line 53, after "output", delete "data-vector" and insert -- data vector --.

Signed and Sealed this

Fifth Day of August, 2003

JAMES E. ROGAN
*Director of the United States Patent and Trademark Office*